United States Patent
Sato et al.

(10) Patent No.: US 12,539,688 B2
(45) Date of Patent: Feb. 3, 2026

(54) FLEXIBLE ORGANIC EL DISPLAY DEVICE, AND FRONT PANEL FOR DISPLAY DEVICE

(71) Applicant: DAI NIPPON PRINTING CO., LTD., Tokyo (JP)

(72) Inventors: Jun Sato, Tokyo (JP); Gen Furui, Tokyo (JP); Atsuhiro Kobayashi, Tokyo (JP); Yoshimasa Ogawa, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 735 days.

(21) Appl. No.: 17/906,687

(22) PCT Filed: Mar. 23, 2021

(86) PCT No.: PCT/JP2021/011902
§ 371 (c)(1),
(2) Date: May 9, 2023

(87) PCT Pub. No.: WO2021/193599
PCT Pub. Date: Sep. 30, 2021

(65) Prior Publication Data
US 2023/0345799 A1 Oct. 26, 2023

(30) Foreign Application Priority Data
Mar. 23, 2020 (JP) .................. 2020-051558

(51) Int. Cl.
*B32B 17/10* (2006.01)
*B32B 7/12* (2006.01)
(Continued)

(52) U.S. Cl.
CPC ............. *B32B 17/10* (2013.01); *B32B 7/12* (2013.01); *B32B 27/08* (2013.01); *B32B 27/308* (2013.01);
(Continued)

(58) Field of Classification Search
CPC ........... B32B 17/10; B32B 7/12; B32B 27/08; B32B 27/308; B32B 27/36;
(Continued)

(56) References Cited

U.S. PATENT DOCUMENTS 12,030,281 B2 * 7/2024 Sato ..................... B29C 65/48
2016/0009593 A1 * 1/2016 Brychell ................ B32B 17/06
156/60

(Continued)

FOREIGN PATENT DOCUMENTS

| CN | 105228823 | 1/2016 |
| CN | 110753619 | 2/2020 |

(Continued)

*Primary Examiner* — Victor A Mandala
(74) *Attorney, Agent, or Firm* — HSML P.C.

(57) ABSTRACT

The present disclosure provides a flexible organic electroluminescence display device comprising a front panel placed on an observer side of an organic electroluminescence display panel, wherein the front panel includes a glass substrate, with a thickness of 100 μm or less, on the organic electroluminescence display panel, and a resin layer on the glass substrate; in a plane of the resin layer, when a composite elastic modulus of a first direction is regarded as E1, a composite elastic modulus of a second direction that is a direction orthogonally crossing the first direction is regarded as E2, E1/E2 is 1.2 or more; and an angle formed by a folding direction of the flexible organic electroluminescence display device and the first direction is 45° or more and 90° or less.

11 Claims, 6 Drawing Sheets

(51) Int. Cl.
*B32B 27/08* (2006.01)
*B32B 27/30* (2006.01)
*B32B 27/36* (2006.01)
*H10K 59/80* (2023.01)
*H10K 77/10* (2023.01)
*H10K 102/00* (2023.01)

(52) U.S. Cl.
CPC ........... *B32B 27/36* (2013.01); *H10K 59/871* (2023.02); *H10K 59/873* (2023.02); *H10K 77/111* (2023.02); *B32B 2255/10* (2013.01); *B32B 2307/54* (2013.01); *B32B 2307/558* (2013.01); *B32B 2307/7376* (2023.05); *B32B 2367/00* (2013.01); *B32B 2457/206* (2013.01); *H10K 59/87* (2023.02); *H10K 2102/311* (2023.02)

(58) Field of Classification Search
CPC ............ B32B 2255/10; B32B 2307/54; B32B 2307/558; B32B 2307/7376; B32B 2367/00; B32B 2457/206; B32B 17/10018; B32B 7/022; B32B 2307/51; H10K 59/871; H10K 59/873; H10K 77/111; H10K 59/87; H10K 2102/31; H10K 2102/311; Y02E 10/549; G09F 9/30; G09F 9/301; H05B 33/02; H05B 33/04

See application file for complete search history.

(56) References Cited

U.S. PATENT DOCUMENTS

| | | |
|---|---|---|
| 2018/0319696 A1 | 11/2018 | Akiba |
| 2019/0300425 A1 | 10/2019 | Ikadai |
| 2020/0144553 A1 | 5/2020 | Ogasawara et al. |
| 2020/0147932 A1* | 5/2020 | Baby ................. B32B 17/10018 |
| 2020/0230925 A1 | 7/2020 | Nishio et al. |
| 2020/0371273 A1* | 11/2020 | Hou ....................... C03C 25/285 |
| 2022/0282130 A1* | 9/2022 | Baby .......................... C09J 9/00 |

FOREIGN PATENT DOCUMENTS

| | | |
|---|---|---|
| JP | 2003337549 | 11/2003 |
| JP | 2016-517359 | 6/2016 |
| JP | 2018163374 | 10/2018 |
| JP | 2018-188335 | 11/2018 |
| JP | 2019-025901 | 2/2019 |
| KR | 10-2019-0056376 | 5/2019 |
| KR | 10-2020-0016927 | 2/2020 |
| KR | 10-2020-0021514 | 2/2020 |
| WO | 2014/133925 | 9/2014 |
| WO | 2018/055998 | 3/2018 |

\* cited by examiner

FLEXIBLE ORGANIC EL DISPLAY DEVICE, AND FRONT PANEL FOR DISPLAY DEVICE

TECHNICAL FIELD

The present disclosure relates to a flexible organic EL display device, and a front panel for a display device.

BACKGROUND ART

In order to protect a display device, a front panel including a glass substrate or a resin substrate is conventionally used for the display device. This front panel is configured to protect the display device from an impact or a scratch, and a strength, an impact resistance, and a scratch resistance, for example, are required. The glass substrate has features such as high surface hardness so that it is unlikely to get scratched, and high transparency. Meanwhile, the resin substrate has features such as light weight, and chip-proof. Generally, the thicker the thickness of the front panel, higher in function to protect the display device form an impact. The quality of the material and the thickness of the front panel is appropriately selected and used in view of, for example, weight, cost, and size of the display device.

In recent years, flexible displays such as a foldable display, a rollable display, and a bendable display have been actively developed.

In the flexible display, since a front panel is also required to be folded so as to conform the movement of the display device, a front panel which can be folded is applied. As for a glass substrate, a glass substrate wherein glass is made foldable by thinning such as ultra-thin plate glass (Ultra-Thin Glass; UTG) is under investigation (for example, refer to Patent Document 1). Among the glass, one referred to as chemically strengthened glass has particularly high bending resistance, and the glass is made chip-proof by internalizing an expansive stress on the glass surface so that a minute scratch occurred in the glass surface does not grow when bent.

Since the elastic modulus of glass is higher compared to resin, when they have the same thickness, the glass has higher ability to protect the display device than the resin. Also, the glass is high in optical transparency, and thus a display device having better visibility may be produced. Meanwhile, when the glass is thinned, it is more likely to be cracked so that impact resistance is drastically deteriorated. When the glass substrate of the front panel is cracked by an impact from outside, not only the function to protect the display device is deteriorated, but also there is a risk of injuring the user's fingertip or the like with an arisen shard or a sharp edge.

Thus, a stacking of a resin layer on a glass substrate has been proposed. For example, Patent Document 2 discloses a stacked body wherein a thinned glass plate and a resin film are stacked via an adhesive layer. Also, for example, Patent Document 3 discloses a cover glass comprising a glass layer; a viscoelastic body layer; and an acoustic impedance adjusting layer placed between the glass layer and the viscoelastic body layer.

CITATION LIST

Patent Documents

Patent Document 1: Japanese Patent Application Laid-Open (JP-A) No. 2018-188335
Patent Document 2: JP-A No. 2019-25901
Patent Document 3: WO2018/055998

SUMMARY OF DISCLOSURE

Technical Problem

In a display device provided with a front panel including a glass substrate and a resin layer, by placing the resin layer on the observer side than the glass substrate, a crack of the glass due to an impact may be suppressed by the resin layer, and impact resistance may be improved. However, the impact resistance and the bending resistance of the resin layer are considered to be properties contradicting each other, as will be described later. Therefore, there is a need for a resin layer having both of impact resistance and bending resistance.

The present disclosure has been made in view of the above circumstances, and a main object of the present disclosure is to provide a flexible organic EL display device excellent in impact resistance and bending resistance, and a front panel for a display device used for the same.

Solution to Problem

In order to solve the problem, as the result of intensive studies, the inventors of the present disclosure have found out that, in a front panel including a glass substrate and a resin layer, bending resistance may be improved while improving impact resistance by employing a resin layer having a predetermined elastic modulus anisotropy, and by setting a predetermined relationship between a relatively high elastic modulus direction and a relatively low elastic modulus direction in a plane of the resin layer; and a folding direction of a display device. The present disclosure is based on such findings.

One embodiment of the present disclosure provides a flexible organic electroluminescence display device comprising: an organic electroluminescence display panel; and a front panel placed on an observer side of the organic electroluminescence display panel, wherein the front panel includes a glass substrate, with a thickness of 100 μm or less, on the organic electroluminescence display panel, and a resin layer on the glass substrate; in a plane of the resin layer, when a composite elastic modulus of a first direction is regarded as E1, and a composite elastic modulus of a second direction that is a direction orthogonally crossing the first direction is regarded as E2, E1/E2 is 1.2 or more; and an angle formed by a folding direction of the flexible organic electroluminescence display device and the first direction is 45° or more and 90° or less.

Another embodiment of the present disclosure provides a front panel for a display device comprising a glass substrate with a thickness of 100 μm or less; and a resin layer on the glass substrate, wherein in a plane of the resin layer, when a composite elastic modulus of a first direction is regarded as E1, a composite elastic modulus of a second direction that is a direction orthogonally crossing the first direction is regarded as E2, E1/E2 is 1.2 or more.

In the present disclosure, an average value of the composite elastic modulus of the first direction E1 and the composite elastic modulus of the second direction E2 is preferably 4.0 GPa or more. Incidentally, the "GPa" indicates gigapascal which is a unit of pressure.

Also, the front panel for a display device in the present disclosure may include a pressure-sensitive adhesive layer between the glass substrate and the resin layer.

Further, the front panel for a display device in the present disclosure may include the glass substrate, the resin layer, and a functional layer on the resin layer in this order.

Advantageous Effects of Disclosure

The present disclosure has an effect that a flexible organic EL display device and a front panel for a display device excellent in impact resistance and bending resistance, may be provided.

DESCRIPTION OF EMBODIMENTS

Embodiments in the present disclosure are hereinafter explained with reference to, for example, drawings. However, the present disclosure is enforceable in a variety of different forms, and thus should not be taken as is limited to the contents described in the embodiments exemplified as below. Also, the drawings may show the features of the present disclosure such as width, thickness, and shape of each part schematically comparing to the actual form in order to explain the present disclosure more clearly in some cases; however, it is merely an example, and thus does not limit the interpretation of the present disclosure. Also, in the present description and each drawing, for the factor same as that described in the figure already explained, the same reference sign is indicated and the detailed explanation thereof may be omitted.

In the present descriptions, in expressing an aspect wherein some member is placed on the other member, when described as merely "on" or "below", unless otherwise stated, it includes both of the following cases: a case wherein some member is placed directly on or directly below the other member so as to be in contact with the other member, and a case wherein some member is placed on the upper side or the lower side of the other member via yet another member. Also, in the present descriptions, on the occasion of expressing an aspect wherein some member is placed on the surface of the other member, when described as merely "on the surface side" or "on the surface", unless otherwise stated, it includes both of the following cases: a case wherein some member is placed directly on or directly below the other member so as to be in contact with the other member, and a case wherein some member is placed on the upper side or the lower side of the other member via yet another member.

A flexible organic EL display device, and a front panel for a display device in the present disclosure are hereinafter described in detail.

A. Flexible Organic EL Display Device

The flexible organic EL display device in the present disclosure comprises: an organic electroluminescence display panel; and a front panel placed on an observer side of the organic electroluminescence display panel, wherein the front panel includes a glass substrate, with a thickness of 100 μm or less, on the organic electroluminescence display panel, and a resin layer on the glass substrate; in a plane of the resin layer, when a composite elastic modulus of a first direction is regarded as E1, and a composite elastic modulus of a second direction that is a direction orthogonally crossing the first direction is regarded as E2, E1/E2 is 1.2 or more; and an angle formed by a folding direction of the flexible organic electroluminescence display device and the first direction is 45° or more and 90° or less.

Figure 1:
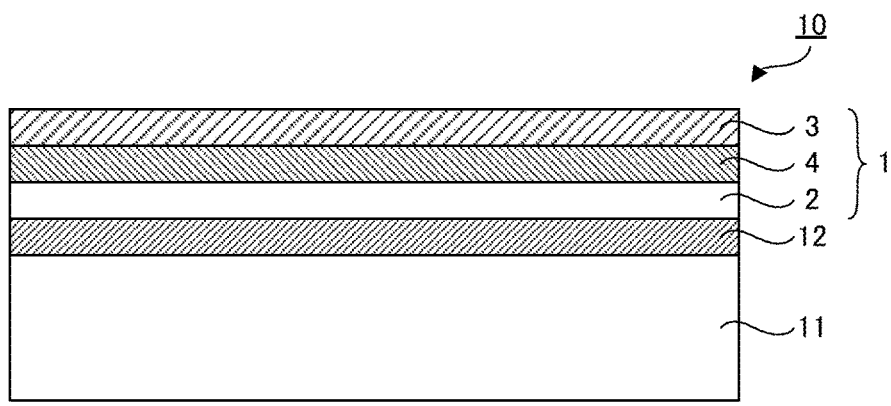
FIG. 1 is a schematic cross-sectional view illustrating an example of the flexible organic EL display device in the present disclosure.

FIG. 1 is a schematic cross-sectional view illustrating an example of a flexible organic EL display device in the present disclosure. As shown in FIG. 1, flexible organic EL display device 10 comprises an organic EL display panel 11, and a front panel 1 placed on the observer side of the organic EL display panel 11. The front panel 1 includes a glass substrate 2, and a resin layer 3 in this order from the organic EL display panel 11 side. The glass substrate 2 has a predetermined thickness, and the resin layer 3 has a predetermined composite elastic modulus anisotropy. The front panel 1 may include a pressure-sensitive adhesive layer 4 between the glass substrate 2 and the resin layer 3. Also, in the flexible organic EL display device 10, a pressure-sensitive adhesive layer or an adhesive layer 12 may be placed between the front panel 1 and the organic EL display panel 11.

Since the thickness of the glass substrate of the front panel in the present disclosure is the predetermined value or less, and the thickness is thin, there is a concern that it is easily cracked, and low in impact resistance. However, since the resin layer is placed on the glass substrate, on the opposite surface side to the organic EL display panel, when an impact is applied to the front panel in the flexible organic EL display device, the resin layer may absorb the impact and a crack of the glass substrate may be suppressed so that the impact resistance may be improved. Further, even when the glass substrate is broken, the resin layer may suppress glass from being scattered.

Figure 2:
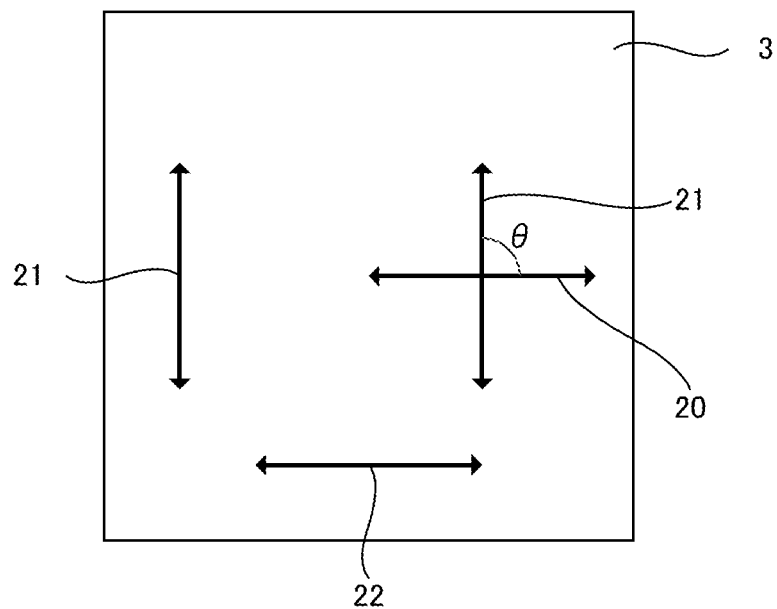
FIG. 2 is a schematic plan view illustrating an example of the resin layer in the present disclosure.

As exemplified in FIG. 2, in the front panel in the present disclosure, in a plane of the resin layer 3, when the composite elastic modulus of a first direction 21 is regarded as E1, and the composite elastic modulus of a second direction 22 orthogonally crossing the first direction 21 is regarded as E2, E1/E2 is 1.2 or more. That is, the composite elastic modulus E1 of the first direction 21 is relatively high, and the composite elastic modulus E2 of the second direction 22 is relatively low. In other words, the resin layer 3 has a predetermined elastic modulus anisotropy.

Here, the composite elastic modulus is a physical property value indicating difficulty in being elastically deformed. In the present disclosure, in the plane of the resin layer 3, the composite elastic modulus E1 of the first direction 21 is relatively high, and the composite elastic modulus E2 of the second direction 22 is relatively low. Thus, in relation to the first direction 21 and the second direction 22, the resin layer 3 may be said that it is relatively hardly deformed elastically in the first direction 21 whose composite elastic modulus is relatively high, and is relatively easily deformed elastically in the second direction 22 whose composite elastic modulus is relatively low.

In the flexible organic EL display device in the present disclosure, in the plane of the resin layer 3, as shown in FIG. 2, the angle θ formed by the first direction 21 whose composite elastic modulus is relatively high and the folding direction 20 of the flexible organic EL display device is 45° or more and 90° or less. In this case, the angle formed by the second direction 22 whose composite elastic modulus is relatively low and the folding direction 20 of the flexible organic EL display device in the plane of the resin layer 3 is 0° or more and 45° or less.

Figure 3A:
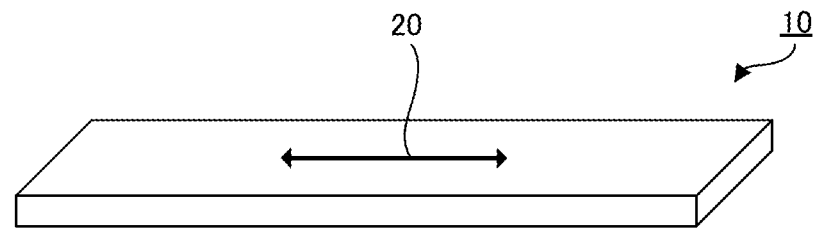
FIGS. 3A and 3B are schematic perspective views illustrating an example of the flexible organic EL display device in the present disclosure.
Figure 3B:
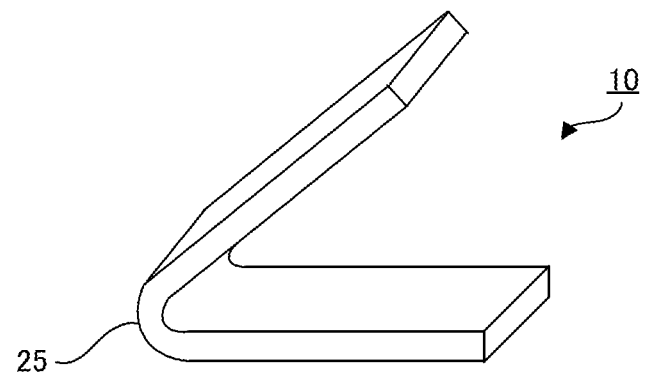

FIGS. 3A and 3B are schematic perspective views illustrating an example of the flexible organic EL display device in the present disclosure. FIG. 3A shows an open condition of the flexible organic EL display device 10, and FIG. 3B shows a folded condition of the flexible organic EL display device 10. As shown in FIGS. 3A and 3B, the folding direction 20 of the flexible organic EL display device 10 refers to a direction to which the flexible organic EL display device 10 is folded. Incidentally, the folding direction of the flexible organic EL display device may be, for example, either one of the longitudinal direction and the width direction of the flexible organic EL display device, and is not particularly limited.

In the present disclosure, by setting the relationship described above between the first direction 21 having relatively high elastic modulus and the second direction 22 having relatively low elastic modulus in a plane of the resin layer 3; and the folding direction 20 of the flexible organic EL display device, bending resistance may be improved. The reason therefor is presumed as follows.

Here, when the flexible organic EL display device 10 is folded as shown in FIG. 3B, for example, a stress is applied to the bent portion 25 of the flexible organic EL display device 10, and is strained. At this time, in the front panel in the flexible organic EL display device 10, since glass has higher elastic modulus compared to resin so that the glass substrate would be the neutral surface, when folded, the stress and strain applied to the bent portion of the resin layer which is away from the neutral surface is high.

For example, when the second direction having relatively low composite elastic modulus in a plane of the resin layer, and the folding direction of the flexible organic EL display device is approximately parallel, that is, when the angle formed by the second direction having relatively low composite elastic modulus in a plane of the resin layer, and the folding direction of the flexible organic EL display device is approximately 0°, since the composite elastic modulus of the second direction in a plane of the resin layer is relatively low, the stress applied to the bent portion of the resin layer is decreased. Therefore, the bent portion of the resin layer endures the stress so that a condition wherein a plastic deformation is not likely to occur, is maintained even the flexible organic EL display device is opened after being folded repeatedly. As the result, it is presumed that the flexible organic EL display device easily returns to the flat condition, that is, the restorability after being folded repeatedly is excellent, and a crease or a folding mark hardly occurs.

Meanwhile, for example, when the first direction having relatively high composite elastic modulus in a plane of the resin layer, and the folding direction of the flexible organic EL display device is approximately parallel, that is, when the angle formed by the first direction having relatively high composite elastic modulus in a plane of the resin layer, and the folding direction of the flexible organic EL display device is approximately 0°, since the composite elastic modulus of the first direction in a plane of the resin layer is relatively high, the stress applied to the bent portion of the resin layer is increased. Therefore, the bent portion of the resin layer cannot endure the stress so that a plastic deformation is likely to occur, when the flexible organic EL display device is opened after being folded repeatedly. As the result, it is presumed that the flexible organic EL display device hardly returns to the flat condition, that is, the restorability after being folded repeatedly is low, and a crease or a folding mark easily occurs.

Also, when the angle formed by the second direction having relatively low composite elastic modulus in a plane of the resin layer and the folding direction of the flexible organic EL display device is 0° or more and 45° or less, that is, when the angle θ formed by the first direction having relatively high composite elastic modulus in a plane of the resin layer and the folding direction of the flexible organic EL display device is 45° or more and 90° or less, the stress applied to the bent portion of the resin layer is decreased when the flexible organic EL display device is folded repeatedly, as compared with the case where the angle θ formed by the first direction having relatively high composite elastic modulus in a plane of the resin layer and the folding direction of the flexible organic EL display device is approximately 0°. Therefore, also when the angle formed by the second direction having relatively low composite elastic modulus in a plane of the resin layer and the folding direction of the flexible organic EL display device is 0° or more and 45° or less, that is, when the angle θ formed by the first direction having relatively high composite elastic modulus in a plane of the resin layer and the folding direction of the flexible organic EL display device is 45° or more and 90° or less, as described above, the stress applied to the bent portion of the resin layer is low, and the bent portion of the resin layer endures the stress so that a condition wherein a plastic deformation is not likely to occur, is maintained even the flexible organic EL display device is opened after being folded repeatedly. As the result, it is presumed that the flexible organic EL display device easily returns to the flat condition, that is, the restorability after being folded repeatedly is excellent, and a crease or a folding mark hardly occurs.

Here, when the elastic modulus of the resin layer is increased, the surface hardness of the resin layer may be increased, so that a crack of the glass substrate may be suppressed to improve impact resistance, and the antiscattering property of the glass may be improved. However, when the elastic modulus of the resin layer is increased, since the stress and strain applied to the bent portion of the resin layer when the resin layer is folded become large, the restorability after the folded condition is lowered, and the bending resistance may be lowered. In this way, in the resin layer, impact resistance and the bending resistance are considered to be contradicting properties.

Meanwhile, according to the present disclosure, since the resin layer has a predetermined elastic modulus anisotropy as described above, by increasing the composite elastic modulus in the first direction in the plane of the resin layer, impact resistance may be improved by increasing the composite elastic modulus of the whole resin layer. Also, the bending resistance may be improved by lowering the composite elastic modulus in the second direction in the plane of the resin layer, and by setting a predetermined relationship between the first direction and second direction in the plane of the resin layer, and the folding direction of the flexible organic EL display device.

Therefore, in the present disclosure, impact resistance may be improved as well as improving the bending resistance. Furthermore, even when the glass substrate of the front panel is damaged, and a risk of a human body being injured may be decreased so that a flexible organic EL display device with higher safety may be provided.

Each configuration of the flexible organic EL display device in the present disclosure will be hereinafter described.

1. Front Panel

The front panel in the present disclosure is a member placed on the observer side of the organic EL display panel, and includes, in order from the organic EL display panel side, a glass substrate having a predetermined thickness, and a resin layer having a predetermined composite elastic modulus anisotropy.

Each configuration of the front panel in the present disclosure will be hereinafter described.

(1) Resin Layer

The resin layer in the present disclosure is a member placed on one surface side of the glass substrate, and in the plane of the resin layer, when the composite elastic modulus of the first direction is regarded as E1, and the composite elastic modulus of the second direction orthogonally crossing the first direction is regarded as E2, E1/E2 is 1.2 or more. Also, the angle formed by a folding direction of the flexible organic EL display device in the present disclosure and the first direction in the resin layer is 45° or more and 90° or less. The resin layer is a member having an impact absorbing property, and also functions as a member suppressing glass from being scattered, when the glass substrate is broken. The resin layer has transparency, and the resin layer is placed on the observer side than the glass substrate in the flexible organic EL display device in the present disclosure.

In the plane of the resin layer, when the composite elastic modulus of the first direction is regarded as E1, and the composite elastic modulus of the second direction orthogonally crossing the first direction is regarded as E2, E1/E2 is 1.2 or more, preferably 1.3 or more, and more preferably 1.4 or more. By increasing the composite elastic modulus in the first direction and decreasing the composite elastic modulus in the second direction in the plane of the resin layer so that the ratio of E1/E2 falls in the above range, the bending resistance may be improved while ensuring the impact resistance.

Also, E1/E2 is preferably, for example, 3.0 or less, more preferably 2.5 or less, and further preferably 2.0 or less. When the ratio of E1/E2 is too high, it may be difficult to increase the composite elastic modulus of the whole resin layer, and a sufficient impact resistance may not be obtained.

The composite elastic modulus E1 in the first direction and the composite elastic modulus E2 in the second direction of the resin layer may satisfy the ratio of E1/E2, and the average value of the composite elastic modulus E1 in the first direction and the composite elastic modulus E2 in the second direction is preferably, for example, 4.0 GPa or more, more preferably 4.3 GPa or more, and further preferably 4.5 GPa or more. By the average value of E1 and E2 being in the above range, the composite elastic modulus of the whole resin layer may be increased to suppress a crack of the glass substrate due to an impact, to improve impact resistance, and to improve the antiscattering property of the glass.

Also, according to the method for measuring the composite elastic modulus described later, since the composite elastic modulus of the glass substrate is approximately 40 GPa, the average of the composite elastic modulus E1 in the first direction and the composite elastic modulus E2 in the second direction of the resin layer is preferably, for example, 20 GPa or less, and more preferably 10 GPa or less.

The composite elastic modulus E1 in the first direction of the resin layer may satisfy the ratio of E1/E2 described above, and may further satisfy the average value of the composite elastic modulus E1 in the first direction and the composite elastic modulus E2 in the second direction described above, and is preferably, for example, 4.0 GPa or more and 40 GPa or less, more preferably 4.5 GPa or more and 20 GPa or less, and further preferably 5.0 GPa or more and 10 GPa or less. By increasing the composite elastic modulus in the first direction so that the composite elastic modulus E1 in the first direction of the resin layer is in the above range, the composite elastic modulus of the whole resin layer may be increased to suppress a crack of the glass substrate due to an impact, thereby improving impact resistance and also improving the antiscattering property of the glass.

The composite elastic modulus E2 in the second direction of the resin layers may satisfy the ratio of E1/E2 described above, and may further satisfy the average value of the composite elastic modulus E1 in the first direction and the composite elastic modulus E2 in the second direction, and is preferably, for example, 3.0 GPa or more and 40 GPa or less, more preferably 3.5 GPa or more and 20 GPa or less, and further preferably 4.0 GPa or more and 10 GPa or less. By reducing the composite elastic modulus in the second direction so that the composite elastic modulus E2 in the second direction of the resin layer is in the above range, the bending resistance may be improved.

Here, the composite elastic modulus of the resin layer is calculated using contact projection area $A_p$ determined when measuring the indentation hardness ($H_{IT}$) of the resin layer. The "indentation hardness" is a value determined from a load-displacement curve from indenter loading to unloading obtained by a hardness measurement by the nanoindentation method. The composite elastic modulus of the resin layer is an elastic modulus including the elastic deformation of the resin layer and the elastic deformation of the indenter.

Incidentally, the reason why the composite elastic modulus assuming a compressive elasticity using an indenter is used as a parameter in relation to bending resistance in the present disclosure is as follows.

When a foldable flexible organic EL display device is folded, it is folded so that the resin layer side of the glass substrate is on the concave side. In this case, since the glass substrate with high elastic modulus is usually a neutral axis, a compressive stress is applied to the resin layer when folded. Therefore, in order to employ a parameter which approximates this situation, the composite elastic modulus assuming a compressive elasticity is used as a parameter, but not a tensile elasticity.

Also, in relation to the composite elastic modulus assuming a tensile elasticity, the result tends to vary depending on the edge surface condition of a test piece. However, the composite elastic modulus assuming a compressive elasticity using an indenter is not likely to be influenced by the edge surface condition so that a stable result tends to be obtained. Therefore, the composite elastic modulus assuming a compressive elasticity is used as a parameter, not a tensile elasticity.

The measurement of the indentation hardness ($H_{IT}$) is carried out, to a measurement sample, using "TI950 TriboIndenter" from Bruker Corporation. Specifically, at first, a block wherein a front panel cut out to a size of 1 mm×10 mm is embedded in an embedding resin is prepared, and a uniform section with a thickness of 50 nm or more and 100 nm or less without a hole, for example, is cut out from this block by a common section preparing method. For the preparation of the section, for example, "Ultramicrotome EM UC7" (from Leica Microsystems, Inc.) may be used. Then, the remaining of the block from which this uniform section without a hole, for example, is cut out is used as a measurement sample. Then, onto the cross-section in such the measurement sample obtained by cutting out the section, a Berkovich indenter (a triangular pyramid, TI-0039 from Bruker Corporation) as the indenter is compressed perpendicularly onto the center of the cross-section of the resin layer until the compression depth of 200 nm at compression speed of 10 nm/sec, under the following measurement conditions. Here, in order to avoid an influence of the glass substrate, and in order to avoid an influence of the side edge of the resin layer, the Berkovich indenter shall be compressed into a portion of the resin layer which is 500 nm or more away from the interface between the glass substrate and the resin layer toward the center side of the resin layer, and 500 nm or more away from both side edges of the resin layer respectively toward the center side of the resin layer. Incidentally, when an arbitrary layer such as a hard coating layer is present on the resin layer, on the opposite side surface to the glass substrate side surface, the Berkovich indenter shall be compressed into a portion of the resin layer which is 500 nm or more away also from the interface between the arbitrary layer and the resin layer toward the center side of the resin layer. Then, after relieving the remaining stress by maintaining constant, the load was unloaded, the maximum load after relieving was measured, and by using the maximum load $P_{max}$ and the contact projection area $A_p$, the indentation hardness ($H_{IT}$) is calculated by $P_{max}/A_p$. The contact projection area is a contact projection area wherein the indenter tip curvature is corrected by Oliver-Pharr method, using a reference sample fused quartz (5-0098 from Bruker Corporation). The indentation hardness ($H_{IT}$) is an arithmetic average value of the value obtained by measuring at 15 places. Incidentally, when a value deviating ±20% or more from the arithmetic average value is included in the measured value, that measured value is excluded, and the measurement is carried out for one more time. Whether the value deviating ±20% or more from the arithmetic average value exists in the measured value, or not is determined by finding out whether the value (%) obtained by (A−B)/B×100, when the measured value is regarded as A and the arithmetic average value is regarded as B, is ±20% or more, or not. The indentation hardness ($H_{IT}$) may be adjusted by the type of the resin, for example, included in the resin layer described later.

Measurement Conditions

Compression depth: 200 nm
Compression speed: 10 nm/second
Retention time: 5 seconds
Unloading speed: 10 nm/second
Measuring temperature: 25° C.

The composite elastic modulus $E_r$ of the resin layer is determined from the following mathematical formula (1), using contact projection area $A_p$ obtained when measuring the indentation hardness. As for the composite elastic modulus, the indentation hardness is measured at 15 places, determining the composite elastic modulus each time, and the arithmetic average value of the obtained composite elastic modulus of 15 places is regarded as the composite elastic modulus.

[Mathematic 1]

$$E_r = \frac{S\sqrt{\pi}}{2\sqrt{A_p}} \quad (1)$$

(In the mathematic formula (1), $A_p$ is a contact projection area, $E_r$ is the composite elastic modulus of the resin layer, and S is a contact stiffness indicated by the gradient immediately after the start of unloading in a load-displacement curve.)

Incidentally, when measuring the composite elastic modulus in the first direction of the resin layer, the indentation hardness is measured on a cross-section surface cut along the second direction orthogonally crossing the first direction. Also, when measuring the composite elastic modulus of the second direction in the resin layer, the indentation hardness is measured on a cross-section surface cut along the first direction orthogonally crossing the second direction.

Also, in the method for measuring the composite elastic modulus of the resin layer described above, the measurement sample is prepared from the front panel, and the measurement sample may be prepared from only the resin layer.

The first direction in the plane of the resin layer is preferably the main orientation direction. That is, the first direction in the plane of the resin layer is preferably a direction exhibiting the maximum refractive index in the plane of the resin layer. This is because, in a resin layer, molecules generally tend to be oriented along the main orientation direction, and the composite elastic modulus in the main orientation direction tends to be high.

Incidentally, the main orientation direction refers to, for example, the orientation direction when the resin layer is uniaxially orientated, and refers to an orientation direction with higher orientation magnification when the resin layer is biaxially orientated.

Also, the main orientation direction of the resin layer may be, for example, either MD direction or TD direction. That is, when the first direction in the plane of the resin layer is the main orientation direction, the first direction in the plane of the resin layer may be, for example, either MD direction or TD direction.

Incidentally, the MD direction (Machine Direction) refers to a flow direction of the resin film, and the TD direction (Transverse Direction) refers to a direction orthogonally crossing the MD direction.

In the present disclosure, as shown in FIG. 2, the angle θ formed by the first direction 21 whose composite elastic modulus is relatively high in the plane of the resin layer 3, and the folding direction 20 of the flexible organic EL display device is 45° or more and 90° or less. The angle θ is preferably 60° or more and 90° or less, more preferably 75° or more and 90° or less, further preferably 85° or more and 90° or less, and particularly preferably 90°. Incidentally, the angle θ refers to a smaller angle among the angles formed by the first direction having relatively high composite elastic modulus in a plane of the resin layer and the folding direction of the flexible organic EL display device. By the angle θ being in the above range, when the flexible organic EL display device is opened after being folded repeatedly, the flexible organic EL display device easily returns to the flat condition, that is, the restorability after being folded repeatedly is excellent, and a crease or a folding mark hardly occurs. Therefore, the bending resistance when the flexible organic EL display device is repeatedly folded may be improved.

In the case described above, the angle formed by the second direction having relatively low composite elastic modulus in a plane of the resin layer and the folding direction of the flexible organic EL display device is 0° or more and 45° or less, preferably 0° or more and 30° or less, more preferably 0° or more and 15° or less, further preferably 0° or more and 5° or less, and particularly preferably 0°. Incidentally, the angle refers to a smaller angle among the angles formed by the second direction having relatively low composite elastic modulus in a plane of the resin layer and the folding direction of the flexible organic EL display device.

The resin layer has transparency. Specifically, the total light transmittance of the resin layer is preferably 85% or more, more preferably 88% or more, and further preferably 90% or more. By having such a high total light transmittance, a front panel having excellent transparency may be obtained.

Here, the total light transmittance of the resin layer may be measured according to JIS K7361-1:1997, and may be measure with, for example, a haze meter HM150 from Murakami Color Research Laboratory Co., Ltd.

Also, the haze of the resin layer is preferably, for example 5% or less, more preferably 2% or less, and further preferably 1% or less. By having such a low haze, a front panel having excellent transparency may be obtained.

Here, the haze of the resin layer may be measured according to JIS K-7136:2000, and may be measure with, for example, a haze meter HM150 from Murakami Color Research Laboratory Co., Ltd.

The resin included in the resin layer is not particularly limited as long as it is a resin satisfies the composite elastic modulus anisotropy described above, and has transparency. Examples thereof may include polyester based resins, polyimide based resins, polyamideimide based resins, and polyamide based resins. Examples of the polyester based resin may include polyethylene terephthalate, and polyethylene naphthalate.

The resin layer may further include an additive, if necessary. Examples of the additive may include a filler, an ultraviolet absorber, an antioxidant, a light stabilizer, a surfactant, an adhesive improving agent, an antistatic agent, and an easy lubricant.

The thickness of the resin layer is not particularly limited as long as it is a thickness capable of exhibiting impact absorbing property and glass scattering prevention property, and is preferably, for example, 10 µm or more and 200 µm or less, more preferably 20 µm or more and 150 µm or less, and further preferably 30 µm or more and 100 µm or less. When the thickness of the resin layer is too thin, sufficient impact absorbing property and glass scattering prevention property may not be obtained. Also, when the thickness of the resin layer is too thick, flexibility may be deteriorated, the resin layer may be cracked when the flexible organic EL display device is folded.

Here, the thickness of the resin layer may be the average value of the thickness of arbitrary 10 points obtained by measuring from the thickness directional cross-section of the front panel for a display device by observing with a transmission electron microscope (TEM), a scanning electron microscope (SEM), or a scanning transmission electron microscope (STEM). Incidentally, the same may be applied to the measuring methods of the thickness of other layers included in the front panel.

For example, a resin film may be used as the resin layer. The resin film is not particularly limited as long as it satisfies the composite elastic modulus anisotropy described above. For example, a uniaxially oriented film or a biaxially oriented film may be used. Among them, the biaxially oriented film is preferable.

Examples of the method for controlling the composite elastic modulus of the first direction and the second direction in the resin film may include a method wherein the ratio of the orientation or the temperature during the orientation is appropriately set. Specifically, when the ratio of the orientation is higher, or when the temperature during the orientation is lower, the composite elastic modulus in the orientation direction tends to be high. Meanwhile, when the ratio of the orientation is lower, or when the temperature during the orientation is higher, the composite elastic modulus in the orientation direction tends to be low.

(2) Glass Substrate

The glass substrate in the present disclosure has a thickness of 100 µm or less, and is a member configured to support the resin layer.

The glass constituting the glass substrate is not particularly limited as long as it has transparency, and examples thereof may include silicate glass, and silica glass. Among them, borosilicate glass, aluminosilicate glass, and aluminoborosilicate glass are preferable, and alkali-free glass is more preferable. Examples of a commercial product of the glass substrate may include ultra-thin plate glass G-Leaf from Nippon Electric Glass Co., Ltd. and extra-thin film glass from Matsunami Glass Ind., Ltd.

Also, a chemically strengthened glass is also preferable as glass constituting the glass substrate. The chemically strengthened glass is preferable since it has excellent mechanical strength and may be made thin accordingly. The chemically strengthened glass is typically a glass wherein mechanical properties are strengthened by a chemical method by partially exchanging ionic species, such as by replacing sodium with potassium, in the vicinity of the surface of the glass, and includes a compressive stress layer on the surface.

Examples of the glass constituting the chemically strengthened glass substrate may include aluminosilicate glass, soda-lime glass, borosilicate glass, lead glass, alkali barium glass, and aluminoborosilicate glass.

Examples of the commercial products of the chemically strengthened glass substrate may include Gorilla Glass from Corning Incorporated, and Dragontrail from AGC Inc.

The thickness of the glass substrate is 100 µm or less, preferably 15 µm or more and 100 µm or less, more preferably 20 µm or more and 90 µm or less, and further preferably 25 µm or more and 80 µm or less. By the thickness of the glass substrate being thin as in the above range, excellent flexibility may be obtained, and at the same time, sufficient hardness may be obtained. It is also possible to suppress curling of the front panel. Furthermore, it is preferable in terms of reducing the weight of the front panel.

(3) Functional Layer

The front panel in the present disclosure may further include a functional layer on the resin layer, on an opposite surface side to the glass substrate. Examples of the functional layer may include a hard coating layer, an antireflection layer, and an antiglare layer.

Also, the functional layer may be a single layer, and may include a plurality of layers. Also, the functional layer may be a layer having a single function, and may include a plurality of layers having functions different from each other.

(a) Hard Coating Layer

Figure 4:
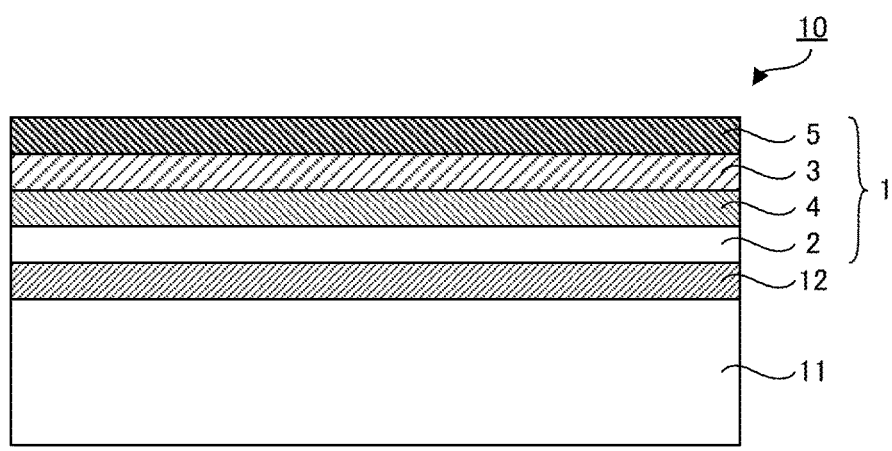
FIG. 4 is a schematic cross-sectional view illustrating an example of the flexible organic EL display device in the present disclosure.

For example, as shown in FIG. 4, the front panel in the present disclosure may further include hard coating layer 5 on the resin layer 3, on an opposite surface side to the glass substrate 2. The hard coating layer is a member configured to increase the surface hardness. By placing the hard coating layer, scratch resistance may be improved.

As a material of the hard coating layer, for example, an organic material, an inorganic material, and an organic-inorganic composite material may be used.

Among the above, the material of the hard coating layer is preferably an organic material. Specifically, the hard coating layer preferably include a cured product of a resin composition including a polymerizable compound. The cured product of a resin composition including a polymerizable compound may be obtained by carrying out a polymerization reaction of a polymerizable compound, by a known method using a polymerization initiator if necessary.

The polymerizable compound includes at least one polymerizable functional group in the molecule. As the polymerizable compound, for example, at least one kind of radical polymerizable compound and cation polymerizable compound may be used.

The radical polymerizable compound is a compound including a radical polymerizable group. The radical polymerizable group included in the radical polymerizable compound may be any functional group capable of generating a radical polymerization reaction, and is not particularly limited; and examples thereof may include a group including a carbon-carbon unsaturated double bond, and specific examples thereof may include a vinyl group and a (meth) acryloyl group. Incidentally, when the radical polymerizable compound includes two or more radical polymerizable groups, these radical polymerizable groups may be the same, and may be different from each other.

The number of radical polymerizable groups included in one molecule of the radical polymerizable compound is preferably two or more, and more preferably three or more, from the viewpoint of improving hardness of the hard coating layer.

Incidentally, in the present specification, (meth) acryloyl represents each of acryloyl and methacryloyl, and (meth) acrylate represents each of acrylate and methacrylate.

The cation polymerizable compound is a compound including a cation polymerizable group. The cation polymerizable group included in the cation polymerizable compound may be any functional group capable of generating a cation polymerization reaction, and is not particularly limited; and examples thereof may include an epoxy group, an oxetanyl group, and a vinyl ether group. Incidentally, when the cation polymerizable compound includes two or more cation polymerizable groups, these cation polymerizable groups may be the same, and may be different from each other.

The number of the cation polymerizable groups included in one molecule of the cation polymerizable compound is preferably two or more, and more preferably three or more, from the viewpoint of improving hardness of the hard coating layer.

The resin composition including the polymerizable compound may include a polymerization initiator if necessary. The polymerization initiator may be used by appropriately selecting from, for example, a radical polymerization initiator, a cation polymerization initiator, and a radical and cation polymerization initiator. These polymerization initiators are decomposed by at least one kind of light irradiation and heating to generate radicals or cations to cause radical polymerization and cation polymerization to proceed. Incidentally, all of the polymerization initiator may be decomposed and may not be left in the hard coating layer, in some cases.

The hard coating layer may further include an additive, if necessary. The additive is not particularly limited, and is appropriately selected according to the function to be imparted to the hard coating layer. Examples thereof may include a filler, an ultraviolet absorber, an infrared absorber, an antiglare agent, an antifoulant, an antistatic agent, a leveling agent, a surfactant, an easy lubricant, various sensitizers, a flame retardant, an adhesive imparting agent, a polymerization inhibitor, an antioxidant, a light stabilizer, and a surface modifier.

The thickness of the hard coating layer may be appropriately selected according to the function of the hard coating layer. The thickness of the hard coating layer is preferably, for example, 2 μm or more and 50 μm or less, more preferably 3 μm or more and 30 μm or less, further preferably 5 μm or more and 20 μm or less, and particularly preferably 6 μm or more and 10 μm or less. When the thickness of hard coating layer is in the above range, sufficient hardness as the hard coating layer may be obtained, as well as a front panel having excellent bending resistance may be obtained.

The method for forming a hard coating layer is appropriately selected according to, for example, material of the hard coating layer, and examples thereof may include a method wherein the resin layer is coated with a curable resin composition for a hard coating layer including the polymerizable compound, and cured; and a vapor-deposition method; and a sputtering method.

(4) Other Constitutions

The front panel in the present disclosure may include other layers in addition to the layers described above, if necessary. Examples of the other layers may include a pressure-sensitive adhesive layer.

For example, as shown in FIG. 1, the front panel in the present disclosure may include a pressure-sensitive adhesive layer 4 between the glass substrate 2 and the resin layer 3. The resin layer may be placed on one surface of the glass substrate via the pressure-sensitive adhesive layer.

The pressure-sensitive adhesive is preferably a relatively soft layer. Specifically, the shear storage elastic modulus of the pressure-sensitive adhesive layer, at 23° C. and frequency of 950 Hz, is preferably 20 MPa or less, more preferably 18 MPa or less, and further preferably 15 MPa or less. Also, the shear storage elastic modulus of the pressure-sensitive adhesive layer is preferably, for example, 0.05 MPa or more, more preferably 0.5 MPa or more, and further preferably 3 MPa or more. By the shear storage elastic modulus of the pressure-sensitive adhesive layer being in the range, it may be a relatively soft layer. In this case, by placing the relatively soft pressure-sensitive adhesive layer between the resin layer and the glass substrate, impact resistance may be improved. The reason therefor is believed that, by the pressure-sensitive adhesive layer being relatively soft and easily deformed, when an impact is applied to the front panel, the deformation of the resin layer is not suppressed by the pressure-sensitive adhesive layer and the resin layer is easily deformed, so that higher impact absorbing effect is exhibited.

Here, the shear storage elastic modulus of the pressure-sensitive adhesive layer, at 23° C. and frequency of 950 Hz, is measured for 3 times, and the shear storage elastic modulus of the pressure-sensitive adhesive layer, at 23° C.

and frequency of 950 Hz is regarded as the arithmetic average value of the three measurements.

Incidentally, the reason why the frequency is set to 950 Hz in the above is that this frequency is included in the frequency range wherein the surface of the front panel is deformed for several µm to several tens of µm, when an object is fallen freely from a height of several cm, and that this frequency is included in the frequency range which imparts an damage to a member such as the display panel placed on the inner side than the front panel in a flexible organic EL display device.

Here, the shear storage elastic modulus G' of the pressure-sensitive adhesive layer may be measured with a dynamic mechanical analyzing device (DMA). When the shear storage elastic modulus G' of the pressure-sensitive adhesive layer is measured with the dynamic mechanical analyzing device (DMA), firstly, the pressure-sensitive adhesive layer is punched into a rectangular shape of 10 mm×5 mm to obtain a measurement sample. Then, two pieces of these measurement samples are prepared and installed into a solid shear jig of the dynamic mechanical analyzing device. Specifically, solid shear jig is provided with three plates in a horizontal direction (one metal inner plate having a thickness of 1 mm, and two metal outer plates placed on both sides of this inner plate; one of the measurement samples is sandwiched between the inner plate and one outer plate, and the other measurement sample is sandwiched between the inner plate and the other outer plate. Then, the solid shear jig is installed into the dynamic mechanical analyzing device with the distance between chucks of 20 mm, and the shear storage elastic modulus G' is measured by applying a strain amount of 1% to the two outer plates, and longitudinal vibrations of frequency range of 950 Hz to the outer plate, while fixing the inner plate, under environment of 23° C. As the dynamic mechanical analyzing device, for example, Rheogel-E4000 from UBM Corporation may be used. Incidentally, the specific measurement conditions in the method described above are shown below.

Measurement Conditions of Shear Storage Elastic Modulus
  Measurement sample: a rectangular shape of 10 mm×5 mm (2 pieces)
  Measurement jig: solid shear
  Strain wave form: sine wave
  Strain control: automatic adjustment
  Frequency: 950 Hz
  Temperature: 23° C.

Also, when measuring the shear storage elastic modulus of the pressure-sensitive adhesive layer, the measurement is carried out after peeling the glass substrate and the resin layer from the pressure-sensitive adhesive layer. The peeling of the glass substrate and the resin layer may be carried out as follows. Firstly, the front panel is heated with a dryer, the blade edge of a cutting knife is inserted into a portion which is assumed to be the interface between the pressure-sensitive adhesive layer and another layer, and the layer is peeled off slowly. By repeating such the heating and peeling, the glass substrate and the resin layer may be peeled off from the pressure-sensitive adhesive layer. Incidentally, the measurement is not greatly influenced by such peeling step.

The pressure-sensitive adhesive used for the pressure-sensitive adhesive layer is not particularly limited as long as the pressure-sensitive adhesive satisfies the shear storage elastic modulus described above, has transparency, and capable of adhering the glass substrate and the resin layer. Examples thereof may include an acrylic based pressure-sensitive adhesive, a silicone based pressure-sensitive adhesive, a rubber based pressure-sensitive adhesive, and an urethane based pressure-sensitive adhesive, and may be appropriately selected according to the material, for example, of the resin layer. Among them, an acrylic based pressure-sensitive adhesive is preferable. This is because it is excellent in transparency, weather resistance, durability, and heat resistance, and is low in cost.

The thickness of the pressure-sensitive adhesive layer is preferably, for example, 10 µm or more and 100 µm or less, more preferably 25 µm or more and 80 µm or less, and further preferably 40 µm or more and 60 µm or less. When the thickness of the pressure-sensitive adhesive layer is too thin, the glass substrate and the resin layer may not be sufficiently adhered, and when an impact is imparted to the front panel, the effect of making the resin layer easily deformed may not be sufficiently obtained. Also, when the thickness of the pressure-sensitive adhesive layer is too thick, flexibility may be deteriorated.

For example, a pressure-sensitive adhesive film may be used as the pressure-sensitive adhesive layer. Also, for example, a supporting body, or the glass substrate or the resin layer may be coated with a composition for a pressure-sensitive adhesive layer to form a pressure-sensitive adhesive layer.

(5) Properties of Front Panel

The total light transmittance of the front panel in the present disclosure is preferably, for example, 85% or more, more preferably 88% or more, and further preferably 90% or more. By having such a high total light transmittance, a front panel having excellent transparency may be obtained.

Here, the total light transmittance of the front panel may be measured according to JIS K7361-1:1997, and may be measure with, for example, a haze meter HM150 from Murakami Color Research Laboratory Co., Ltd.

The haze of the front panel in the present disclosure is preferably, for example 25% or less, more preferably 2% or less, and further preferably 1% or less. By having such a low haze, a front panel having excellent transparency may be obtained.

Here, the haze of the front panel may be measured according to JIS K-7136:2000, and may be measure with, for example, a haze meter HM150 from Murakami Color Research Laboratory Co., Ltd.

The total thickness of the front panel in the present disclosure is not particularly limited as long as it is a thickness capable of obtaining flexibility, and is preferably, for example, 35 µm or more and 400 µm or less, more preferably 65 µm or more and 330 µm or less, and further preferably 95 µm or more and 240 µm or less. By setting the total thickness of the front panel in the range, a front panel having good flexibility may be obtained.

2. Organic EL Display Panel

The organic EL display panel in the present disclosure may have similar structure as a general organic EL display device.

3. Other Constitutions

The flexible organic EL display device in the present disclosure may include a touch-sensitive panel member between the display panel and the front panel. The touch-sensitive panel member may have similar structure as a general touch-sensitive panel member.

4. Flexible Organic EL Display Device

The flexible organic EL display device in the present disclosure is preferably foldable. That is, the flexible organic EL display device in the present disclosure is preferably a foldable display. The flexible organic EL display device in the present disclosure is excellent in bending resistance, and is preferable as a foldable display.

B. Front Panel for a Display Device

The front panel for a display device in the present disclosure comprises a glass substrate with a thickness of 100 μm or less; and a resin layer on the glass substrate, wherein in a plane of the resin layer, when a composite elastic modulus of a first direction is regarded as E1, a composite elastic modulus of a second direction that is a direction orthogonally crossing the first direction is regarded as E2, E1/E2 is 1.2 or more.

Figure 5:
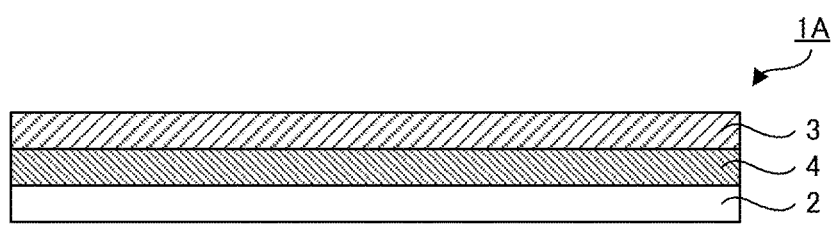
FIG. 5 is a schematic cross-sectional view illustrating an example of the front panel for a display device in the present disclosure.

FIG. 5 is a schematic cross-sectional view illustrating an example of the front panel for a display device in the present disclosure. As shown in FIG. 5, the front panel for a display device 1A comprises a glass substrate 2 and a resin layer 3 placed on one surface side of the glass substrate 2. The glass substrate 2 has a predetermined thickness, and the resin layer 3 has a predetermined composite elastic modulus anisotropy. The front panel for a display device 1A may include a pressure-sensitive adhesive layer 4 between the glass substrate 2 and the resin layer 3.

When used for a display device, in the front panel for a display device in the present disclosure, the first direction and the second direction in the plane of the resin layer, and the folding direction of a display device may have a predetermined relationship, as described in the section of "A. Flexible organic EL display device" above. Therefore, in the front panel for a display device in the present disclosure, since the resin layer has a predetermined elastic modulus anisotropy as described above, the composite elastic modulus of the whole resin layer may be improved so that impact resistance may be improved by increasing the composite elastic modulus of the first direction in the plane of the resin layer. Also, the bending resistance may be improved by decreasing the composite elastic modulus of the second direction in the plane of the resin layer, and by setting a predetermined relationship between the first direction and the second direction in the plane of the resin layer, and the folding direction of the display device.

For the reasons described above, in the present disclosure, impact resistance may be improved as well as improving bending resistance. Further, the front panel for a display device may have higher safety.

Since the front panel for a display device in the present disclosure may be similar to the front panel in the flexible organic EL display device described above, the explanation thereof is omitted here.

The front panel for a display device in the present disclosure has a bending resistance. Specifically, when the dynamic bending test described below is carried out to the front panel for a display device repeatedly for 200,000 times, it is preferable that a crack or a fracture does not occur in the front panel for a display device, and it is more preferable that a crack or a fracture does not occur in the front panel for a display device when the dynamic bending test is carried out repeatedly for 1,000,000 times.

In the dynamic bending test, the front panel for a display device is folded repeatedly so that the angle formed by the folding direction of the front panel for a display device and the first direction in the plane of the resin layer is 90°. In this case, it is preferable that a crack or a fracture does not occur in the front panel for a display device. Among them, it is preferable that a crack or a fracture does not occur in the front panel for a display device when the front panel for a display device is folded repeatedly so that the angle formed by the folding direction of the front panel for a display device and the first direction in the plane of the resin layer is 45° or more and 90° or less. Particularly, it is further preferable that a crack or a fracture does not occur in the front panel for a display device when the front panel for a display device is folded repeatedly so that the folding direction of the front panel for a display device is an arbitrary direction in the plane of the resin layer.

In the dynamic bending test, the front panel for a display device may be folded so that the glass substrate is on the outer side, or the front panel for a display device may be folded so that the glass substrate is on the inner side; and in either of these cases, it is preferable that a crack or a fracture does not occur in the front panel for a display device.

Dynamic Bending Test

Figure 6A:
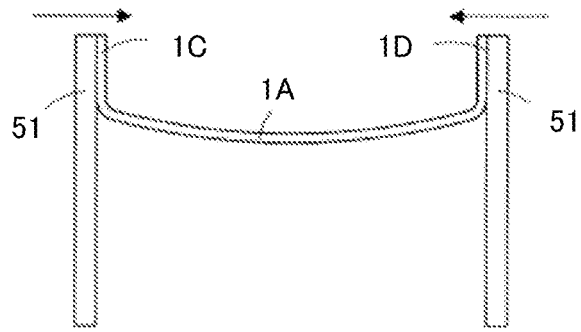
FIGS. 6A to 6C are schematic views explaining a dynamic bending test.
Figure 6B:
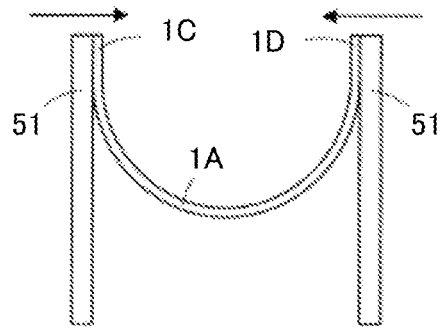
Figure 6C:
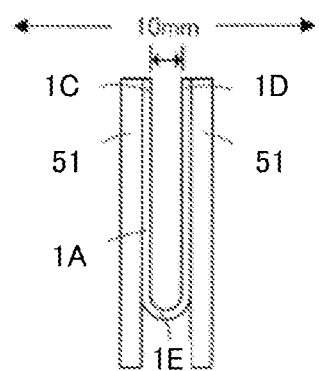

The dynamic bending test is carried out as follows. Firstly, a test piece of a front panel for a display device having a size of 20 mm×100 mm is prepared. In this case, the longitudinal direction of the test piece is parallel to the folding direction. For example, when folding the front panel for a display device so that the angle formed by the folding direction of the front panel for a display device and the first direction in the plane of the resin layer is 90°, the front panel for a display device is folded so that the longitudinal direction of the test piece is parallel to the folding direction, and is orthogonally crossing the first direction in the plane of the resin layer. In the dynamic bending test, as shown in FIG. 6A, short side portion 1C and short side portion 1D opposing to the short side portion 1C of a front panel for a display device 1A are respectively fixed by parallelly arranged fixing portions 51. Also, as shown in FIG. 6A, the fixing portions 51 are movable by sliding in horizontal direction. Then, as shown in FIG. 6B, by moving the fixing portions 51 so as to be closer to each other, the front panel for a display device 1A is deformed so as to be folded. Further, as shown in FIG. 6C, after moving the fixing portions 51 to the position wherein distance between the two opposing short side portions 1C and 1D of the front panel for a display device 1A fixed by the fixing portions 51 is 10 mm, the deformation of the front panel for a display device 1A is dissolved by moving the fixing portions 51 in opposite directions. As shown in FIGS. 6A to 6C, by moving the fixing portions 51, the front panel for a display device 1A may be folded into 180°. Also, by carrying out the dynamic bending test so that bent portion 1E of the front panel for a display device 1A does not protrude from the lower end edge of the fixing portions 51, and by controlling the distance when the fixing portions 51 are the closest, distance between the two opposing short side portions 1C and 1D of the front panel for a display device 1A may be 10 mm. In this case, the outer diameter of the bent portion 1E is regarded as 10 mm.

In the front panel for a display device, it is preferable that a crack or a fracture does not occur when a dynamic bending test wherein the front panel for a display device 1A is folded into 180° so that the distance between the opposing short side portions of the front panel for a display device 1A is 10 mm, is carried out repeatedly for 200,000 times; and it is more preferable that a crack or a fracture does not occur when a dynamic bending test wherein the front panel for a display device is folded into 180° so that the distance between the opposing short side portions of the front panel for a display device is 10 mm, 8 mm, 6 mm, 5 mm, 4 mm, 3 mm, 2.5 mm, or 2 mm is carried out repeatedly for 200,000 times.

Also, when the dynamic bending test is carried out repeatedly for 200,000 times to the front panel for a display device so that the angle formed by the folding direction of the front panel for a display device and the first direction in the plane of the resin layer is 90°, the opening angle after the dynamic bending test in the front panel for a display device is preferably, for example, 90° or more, more preferably 100° or more, and further preferably 110° or more.

Further, it is more preferable that the opening angle after the dynamic bending test in the front panel for a display device is in the range described above, when the dynamic bending test is carried out repeatedly for 200,000 times to the front panel for a display device so that the angle formed by the folding direction of the front panel for a display device and the first direction in the plane of the resin layer is 45° or more and 90° or less.

The inner angle in the front panel for a display device after the dynamic bending test may be measured as follows. After carrying out the dynamic bending test repeatedly for 200,000 times, the fixing portion is taken off from one short side portion of the front panel for a display device, the folded condition is dissolved, and the opening angle that is an angle the front panel for a display device 1A opens naturally, is measured after 30 minutes at room temperature. Incidentally, when the opening angle is large, it means that the restorability is good, and is 180° at a maximum.

In the dynamic bending test, the front panel for a display device may be folded so that the glass substrate is on the inner side, or the front panel for a display device may be folded so that the glass substrate is on the outer side; and in either of these cases, the opening angle after the dynamic bending test is preferably in the range described above.

Also, when the static bending test described below is carried out to the front panel for a display device, the opening angle after the static bending test in the front panel for a display device is preferably, for example, 90° or more, more preferably 100° or more, and further preferably 110° or more.

In the static bending test, the front panel for a display device is folded so that the angle formed by the folding direction of the front panel for a display device and the first direction in the plane of the resin layer is 90°. In this case, the opening angle after the static bending test is preferably in the range described above. Among them, the opening angle after the static bending test is more preferably in the range described above, when the front panel for a display device is folded so that the angle formed by the folding direction of the front panel for a display device and the first direction in the plane of the resin layer is 45° or more and 90° or less.

Static Bending Test

Figure 7A:
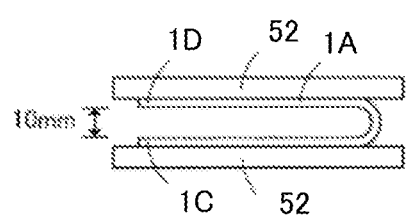
FIGS. 7A and 7B are schematic views explaining a static bending test.
Figure 7B:
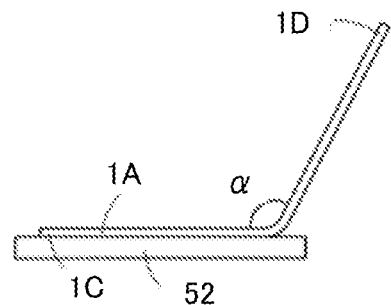

The static bending test is carried out as follows. Firstly, as shown in FIG. 7A, short side portion 1C and short side portion 1D opposing to the short side portion 1C of a front panel for a display device 1A are respectively fixed by parallelly arranged fixing portions 52 so that distance between the short side portion 1C and short side portion 1D is 10 mm. Then, a static bending test wherein the front panel for a display device 1A is left to stand at 23° C. for 240 hours under a folded condition, is carried out. Then, as shown in FIG. 7B, by taking the fixing portion 52 off from the short side portion 1D after the static bending test, the folded condition is dissolved, and after 30 minutes at room temperature, the opening angle α that is an angle the front panel for a display device 1A opens naturally, is measured. Incidentally, the larger opening angle α means that the restorability is high, and is 180° at a maximum.

In the static bending test, the front panel for a display device may be folded so that the glass substrate is on the inner side, or the front panel for a display device may be folded so that the glass substrate is on the outer side; and in either of these cases, it is preferable that the opening angle α after the static bending test is in the range described above.

The front panel for a display device in the present disclosure may be used as a member placed on the observer side than the display panel in a display device. The front panel for a display device in the present disclosure may be used for a display device such as smart phones, tablet terminals, wearable terminals, personal computers, televisions, digital signages, public information displays (PIDs), and car mounted displays. Also, the front panel for a display device in the present disclosure may be used for a display device such as an organic EL display device, and a liquid crystal display device. Among them, the front panel for a display device in the present disclosure may be preferably used for a flexible display such as a foldable display, a rollable display, and a bendable display.

In the front panel for a display device in the present disclosure, the outermost surface after placing the front panel for a display device on the surface of a display device is preferably the resin layer side surface.

A method for placing the front panel for a display device in the present disclosure on the surface of a display device is not particularly limited, and examples thereof may include a method via a pressure-sensitive adhesive layer or an adhesive layer. As for the pressure-sensitive adhesive layer and adhesive layer, a known pressure-sensitive adhesive layer and adhesive layer used to adhere a front panel for a display device may be used.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Example 1

An unoriented resin film was produced by extruding polyethylene terephthalate material melted at 290° C. from a mold to form into a sheet form, and cooling thereof by closely adhering to a cooling roll. Then, using a two axially stretching tester (from Toyo Seiki Seisaku sho, Ltd.), the first orientation of the unoriented resin film was carried out at 120° C. and an orientation magnification of 4.4 times, and then, the second orientation was carried out at an orientation magnification of 1.4 times in the direction 90° with respect to the first orientation direction, and a resin layer with a thickness of 50 μm was obtained.

A chemically strengthened glass substrate with a thickness of 50 μm was adhered on one surface of the resin layer via an acrylic based pressure-sensitive adhesive agent (trade name: 8146-2, from 3M Corporation) with a thickness of 50 μm to produce a front panel.

Example 2

A front panel was produced in the same manner as in Example 1, except that, in Example 1, the first orientation of the unoriented resin film was carried out at 120° C. and an orientation magnification of 3.9 times, and then, the second orientation was carried out at an orientation magnification of 1.4 times in the direction 90° with respect to the first orientation direction, and a resin layer with a thickness of 50 μm was obtained.

Example 3

A front panel was produced in the same manner as in Example 1, except that, in Example 1, the first orientation of the unoriented resin film was carried out at 120° C. and an orientation magnification of 5.8 times, and then, the second orientation was carried out at an orientation magnification of 1.4 times in the direction 90° with respect to the first orientation direction, and a resin layer with a thickness of 50 μm was obtained.

Example 4

A front panel was produced in the same manner as in Example 1, except that, in Example 1, the first orientation of the unoriented resin film was carried out at 120° C. and an orientation magnification of 6.5 times, and then, the second orientation was carried out at an orientation magnification of 1.4 times in the direction 90° with respect to the first orientation direction, and a resin layer with a thickness of 50 μm was obtained.

Comparative Example 1

A front panel was produced in the same manner as in Example 1, except that, in Example 1, the first orientation of the unoriented resin film was carried out at 120° C. and an orientation magnification of 2.5 times, and then, the second orientation was carried out at an orientation magnification of 1.4 times in the direction 90° with respect to the first orientation direction, and a resin layer with a thickness of 50 μm was obtained.

Comparative Example 2

A front panel was produced in the same manner as in Example 1, except that, in Example 1, the first orientation of the unoriented resin film was carried out at 120° C. and an orientation magnification of 2.0 times, and then, the second orientation was carried out at an orientation magnification of 1.4 times in the direction 90° with respect to the first orientation direction, and a resin layer with a thickness of 50 μm was obtained.

Evaluation (1) Composite Elastic Modulus

The composite elastic modulus of the resin layer in Examples and Comparative Examples was determined.

Figure 8:
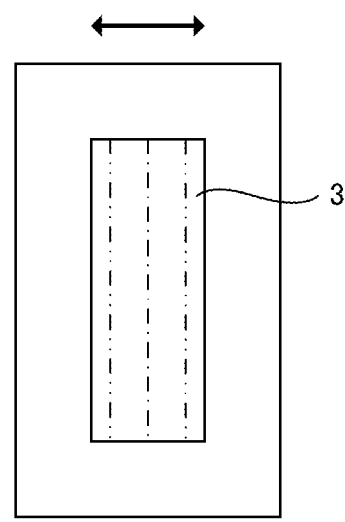
FIG. 8 is a schematic view explaining the measurement site of an indentation hardness.

Firstly, the indentation hardness of the resin layer was measured. The measurement of the indentation hardness ($H_{IT}$) of a measurement sample was carried out using "TI950 TriboIndenter" from Bruker Corporation. Specifically, at first, a block wherein a resin layer cut out to a size of 1 mm×10 mm was embedded in an embedding resin was prepared, and a uniform section with a thickness of 50 nm or more and 100 nm or less without a hole, for example, was cut out from this block by a common section preparing method. For the preparation of the section, "Ultramicrotome EM UC7" (from Leica Microsystems, Inc.) was used. Then, the remaining of the block from which this uniform section without a hole, for example, is cut out was used as a measurement sample. Then, onto the cross-section in the measurement sample obtained by cutting out the section, a Berkovich indenter (a triangular pyramid, TI-0039 from Bruker Corporation) as the indenter was compressed perpendicularly onto the center of the cross-section of the resin layer until the compression depth of 200 nm at compression speed of 10 nm/sec, under the following measurement conditions. Here, as shown in FIG. 8, in order to avoid an influence of the side edge of the resin layer, the Berkovich indenter was compressed into a center portion in the thickness direction of the resin layer 3 (dash-dot-dash line in the figure), and a portion 2 μm inner from the front and back surface of the resin layer 3 (dash-dot-dot-dash line in the figure). Then, after relieving the remaining stress by keeping constant, the load was unloaded, the maximum load after relieving was measured, and by using the maximum load $P_{max}$ and the contact projection area $A_p$, the indentation hardness ($H_{IT}$) was calculated by $P_{max}/A_p$. The contact projection area was a contact projection area wherein the indenter tip curvature was corrected by Oliver-Pharr method, using a reference sample fused silica (5-0098 from Bruker Corporation). The indentation hardness ($H_{IT}$) was measured at 5 places per each of the following portions and the arithmetic average value of the measured value at total of 15 places was regarded as the indentation hardness ($H_{IT}$): a center portion in the thickness direction of the resin layer; a portion 2 μm inner from one surface of the resin layer; and a portion 2 μm inner from another surface of the resin layer. Incidentally, when a value deviating ±20% or more from the arithmetic average value was included in the measured value, that measured value was excluded, and the measurement was carried out for one more time.

Measurement Conditions

Compression depth: 200 nm
Compression speed: 10 nm/second
Retention time: 5 seconds
Unloading speed: 10 nm/second
Measuring temperature: 25° C.

Then, the composite elastic modulus was determined from the mathematical formula (1), using the contact projection area $A_p$ obtained when measuring the indentation hardness ($H_{IT}$) of the obtained resin layer. As for the composite elastic modulus, as described above, the indentation hardness was measured at 15 places, determining the composite elastic modulus each time, and the arithmetic average value of the obtained composite elastic modulus of 15 places was regarded as the composite elastic modulus.

Incidentally, when measuring the composite elastic modulus in the first orientation direction of the resin layer, the indentation hardness was measured in the cross-section cut along the second orientation direction. Also, when measuring the composite elastic modulus in the second orientation direction of the resin layer, the indentation hardness was measured in the cross-section cut along the first orientation direction.

(2) Impact Resistance

An impact test was carried out to the front panel in Examples and Comparative Examples, and the impact resistance was evaluated. Specifically, a front panel was placed on the surface of a soda glass with a thickness of 0.7 mm, via an acrylic based pressure-sensitive adhesive (trade name: 8146-2, from 3M Corporation) with a thickness of 50 μm, so that the resin layer side surface faced upward, and an impact test wherein an iron ball of 100 g weight and 30 mm diameter was dropped form a height of 10 cm onto the resin layer of the front panel, was carried out for 3 times each. Incidentally, in the impact test, the location to which the iron ball was dropped was varied each time. Then, an occurrence of a crack in the soda glass was evaluated visually after the impact test. The impact resistance was evaluated based on the following criteria.
   A: No crack occurred in the soda glass in all 3 tests.
   B: A crack occurred in the soda glass in 1 test or more among the 3 tests.
(3) Bending Resistance (Dynamic Bending Test)

A dynamic bending test was carried out to the front panel in Examples and Comparative Examples, and the bending resistance was evaluated. Specifically, at first, short sides (20 mm) side of a member for a display device having a size of 20 mm×100 mm were respectively fixed by fixing portions, to an endurance testing machine (trade name "DLDMLH-FS" from Yuasa System Co., Ltd.). As shown in FIG. 6C, the minimum distance between the two opposing short side portions was adjusted to be 10 mm, and a dynamic bending test wherein the front panel was folded into 180° was repeated for 200,000 times. In doing so, the front panel was folded so that the resin layer side surface of the front panel was on the inner side, and the glass substrate side surface was on the outer side. Also, using another front panel, a dynamic bending test wherein the front panel was folded so that the resin layer side surface was on the outer side, and the glass substrate side surface was on the inner side, was carried out in the same manner as described above.

Incidentally, when evaluating the bending resistance in the first orientation direction of the resin layer, the folding direction of the front panel and the first orientation direction of the resin layer was made parallel. Also, when evaluating the bending resistance in the second orientation direction of the resin layer, the folding direction of the front panel and the second orientation direction of the resin layer was made parallel. Also, when evaluating the bending resistance in the oblique direction of the resin layer, the angle formed by the folding direction of the front panel and the first orientation direction of the resin layer was set to be 23°, 45°, and 68°.

Then, an occurrence of a crack or fracture in the bent portion was checked after the dynamic bending test. The bending resistance by the dynamic bending test was evaluated based on the following criteria.
   A: A crack or a fracture occurred at the bent portion in none of the dynamic bending tests.
   B: A crack or a fracture occurred at the bent portion in any one of the dynamic bending tests.

Also, by taking off the fixing portion from one short side portion after the dynamic bending test, the folded condition was dissolved, and a condition where the front panel was opened naturally was observed. The folding mark due to the dynamic bending test was evaluated based on the following criteria.
   A: The opening angle was 90° or more after the dynamic bending test in any one of the dynamic bending tests.
   B: The opening angle was less than 90° after the dynamic bending test in all of the dynamic bending tests.
4) Bending Resistance (Static Bending Test A static bending test was carried out to the front panel in Examples and Comparative Examples, and bending resistance was evaluated. Specifically, at first, as shown in FIG. 7A, short side portion 1C and short side portion 1D opposing to the short side portion 1C of a front panel for a display device 1A having a size of 20 mm×100 mm were respectively fixed by parallelly arranged fixing portions 52 so that distance between the short side portion 1C and short side portion 1D was 10 mm. Then, a static bending test wherein the front panel for a display device 1A was left to stand at 23° C. for 240 hours under a folded condition, was carried out. Then, as shown in FIG. 7B, by taking the fixing portion 52 off from the short side portion 1D after the static bending test, the folded condition was dissolved, and after 30 minutes at room temperature, the opening angle that was an angle the front panel for a display device 1A opened naturally, was measured. In doing so, the front panel was folded so that the resin layer side surface of the front panel was on the inner side, and the glass substrate side surface was on the outer side. Also, using another front panel, a static bending test wherein the front panel was folded so that the resin layer side surface was on the outer side, and the glass substrate side surface was on the inner side, was carried out in the same manner as described above.

Incidentally, when evaluating the bending resistance in the first orientation direction of the resin layer, the folding direction of the front panel and the first orientation direction of the resin layer was made parallel. Also, when evaluating the bending resistance in the second orientation direction of the resin layer, the folding direction of the front panel and the second orientation direction of the resin layer was made parallel. Also, when evaluating the bending resistance in the oblique direction of the resin layer, the angle formed by the folding direction of the front panel and the first orientation direction of the resin layer was set to be 23°, 45°, and 68°.

The folding mark due to the static bending test was evaluated based on the following criteria.
   A: The opening angle was 90° or more after the static bending test in any one of the static bending tests.
   B: The opening angle was less than 90° after the static bending test in all of the static bending tests.

TABLE 1

| | Composite elastic modulus (GPa) | | | |
|---|---|---|---|---|
| | E1 (1st orient. dir.) | E2 (2nd orient. dir.) | E1/E2 | Impact resistance |
| Example 1 | 5.35 | 3.78 | 1.42 | A |
| Example 2 | 5.21 | 4.12 | 1.24 | A |
| Example 3 | 5.90 | 3.03 | 1.95 | A |
| Example 4 | 6.01 | 2.88 | 2.09 | A |
| Comp. Ex. 1 | 4.91 | 4.58 | 1.07 | A |
| Comp. Ex. 2 | 4.43 | 4.39 | 1.01 | B |

TABLE 2

| | Direction | Angle formed by folding direct. and 1st orient. direct. of resin layer (°) | Dynamic bending test Crack/fracture | Dynamic bending test Folding mark | Stat. bend. Test Folding mark |
|---|---|---|---|---|---|
| Example 1 | 1st orient. dir. | 0 | A | B | B |
| | 1st to oblique dir. | 23 | A | B | B |
| | Oblique dir. | 45 | A | A | A |
| | Oblique to 2nd dir. | 68 | A | A | A |
| | 2nd orient. dir. | 90 | A | A | A |

TABLE 2-continued

| | Direction | Angle formed by folding direct. and 1st orient. direct. of resin layer (°) | Dynamic bending test Crack/fracture | Dynamic bending test Folding mark | Stat. bend. Test Folding mark |
|---|---|---|---|---|---|
| Example 2 | 1st orient. dir. | 0 | A | B | B |
| | 1st to oblique dir. | 23 | A | B | B |
| | Oblique dir. | 45 | A | A | A |
| | Oblique to 2nd dir. | 68 | A | A | A |
| | 2nd orient. dir. | 90 | A | A | A |
| Example 3 | 1st orient. dir. | 0 | A | B | B |
| | 1st to oblique dir. | 23 | A | B | B |
| | Oblique dir. | 45 | A | A | A |
| | Oblique to 2nd dir. | 68 | A | A | A |
| | 2nd orient. dir. | 90 | A | A | A |
| Example 4 | 1st orient. dir. | 0 | A | B | B |
| | 1st to oblique dir. | 23 | A | B | B |
| | Oblique dir. | 45 | A | B | A |
| | Oblique to 2nd dir. | 68 | A | A | A |
| | 2nd orient. dir. | 90 | A | A | A |
| Comp. Ex. 1 | 1st orient. dir. | 0 | A | B | B |
| | 1st to oblique dir. | 23 | A | B | B |
| | Oblique dir. | 45 | A | B | B |
| | Oblique to 2nd dir. | 68 | A | B | B |
| | 2nd orient. dir. | 90 | A | B | B |
| Comp. Ex. 2 | 1st orient. dir. | 0 | A | A | A |
| | 1st to oblique dir. | 23 | A | A | A |
| | Obliquedir. | 45 | A | A | A |
| | Oblique to 2nd dir. | 68 | A | A | A |
| | 2nd orient. dir. | 90 | A | A | A |

For the front panel in Examples 1 too, since the ratio E1/E2 between the composite elastic modulus E1 of the first direction and the composite elastic modulus E2 of the second direction satisfy 1.2 or more, the bending resistance and impact resistance were excellent when the angle formed by the folding direction and the first direction of the resin layer was 45° or more and 90° or less. Meanwhile, for the front panel in Comparative Examples 1 to 2, since the ratio E1/E2 between the composite elastic modulus E1 of the first direction and the composite elastic modulus E2 of the second direction does not satisfy 1.2 or more, the bending resistance and impact resistance could not be exhibited at the same time, as compared to Examples 1 to 4.

REFERENCE SIGNS LIST

1: front panel
1A: front panel for a display device
2: glass substrate
3: resin layer
4: pressure-sensitive adhesive layer
10: flexible organic EL display device
11: organic EL display panel
20: folding direction of the flexible organic EL display device
21: first direction in the plane of the resin layer
22: second direction in the plane of the resin layer

The invention claimed is:

1. A flexible organic electroluminescence display device comprising:
an organic electroluminescence display panel; and
a front panel placed on an observer side of the organic electroluminescence display panel, wherein
the front panel includes a glass substrate, with a thickness of 100 μm or less, on the organic electroluminescence display panel, and a resin layer on the glass substrate;
in a plane of the resin layer, when a composite elastic modulus of a first direction is regarded as E1, and a composite elastic modulus of a second direction that is a direction orthogonally crossing the first direction is regarded as E2, E1/E2 is 1.2 or more; and
an angle formed by a folding direction of the flexible organic electroluminescence display device and the first direction is 45° or more and 90° or less.

2. The flexible organic electroluminescence display device according to claim 1, wherein an average value of the composite elastic moduli E1 and E2 is 4.0 GPa or more.

3. The flexible organic electroluminescence display device according to claim 1, wherein the front panel includes a pressure-sensitive adhesive layer between the glass substrate and the resin layer.

4. The flexible organic electroluminescence display device according to claim 1, wherein the organic electroluminescence display panel, the front panel, and a functional layer on the resin layer of the front panel are included in this order.

5. The flexible organic electroluminescence display device according to claim 1, wherein the E1/E2 is 3.0 or less.

6. A front panel for a display device, comprising:
a glass substrate with a thickness of 100 μm or less; and
a resin layer on the glass substrate, wherein
in a plane of the resin layer, when a composite elastic modulus of a first direction is regarded as E1, a composite elastic modulus of a second direction that is a direction orthogonally crossing the first direction is regarded as E2, E1/E2 is 1.2 or more, and
wherein an average value of the composite elastic modulus of the first direction E1 and the composite elastic modulus of the second direction E2 is 4.0 GPa or more.

7. The front panel for a display device according to claim 6, wherein the glass substrate, the resin layer, and a functional layer on the resin layer are included in this order.

8. The front panel for a display device according to claim 6, wherein the E1/E2 is 3.0 or less.

9. A front panel for a display device, comprising:
a glass substrate with a thickness of 100 µm or less; and
a resin layer on the glass substrate, wherein
in a plane of the resin layer, when a composite elastic modulus of a first direction is regarded as E1, a composite elastic modulus of a second direction that is a direction orthogonally crossing the first direction is regarded as E2, E1/E2 is 1.2 or more, and
wherein a pressure-sensitive adhesive layer is included between the glass substrate and the resin layer.

10. The front panel for a display device according to claim 9, wherein the glass substrate, the resin layer, and a functional layer on the resin layer are included in this order.

11. The front panel for a display device according to claim 9, wherein the E1/E2 is 3.0 or less.

* * * * *